United States Patent [19]
Ishigaki

[11] Patent Number: 6,147,387
[45] Date of Patent: Nov. 14, 2000

[54] STATIC RANDOM ACCESS MEMORY

[75] Inventor: Yoshiyuki Ishigaki, Hyogo, Japan

[73] Assignee: Mitsubishi Denki Kabushiki Kaisha, Tokyo, Japan

[21] Appl. No.: 09/116,889

[22] Filed: Jul. 16, 1998

[30] Foreign Application Priority Data

Feb. 2, 1998 [JP] Japan ................................. 10-020828

[51] Int. Cl.$^7$ .......................... H01L 29/76; H01L 29/91; H01L 31/062; H01L 31/113; H01L 31/119
[52] U.S. Cl. .......................... 257/380; 257/381; 257/538; 257/904
[58] Field of Search .................. 257/380, 381, 257/538, 904

[56] References Cited

U.S. PATENT DOCUMENTS

| 3,570,114 | 3/1971 | Bean et al. ................................ 438/152 |
| 6,013,940 | 1/2000 | Harada et al. .......................... 257/538 |

FOREIGN PATENT DOCUMENTS

| 60-138956 | 7/1985 | Japan . |
| 61-185964 | 8/1986 | Japan .................................. 257/904 |
| 61-283161 | 12/1986 | Japan . |
| 63-80566 | 4/1988 | Japan .................................. 257/904 |
| 3-165560 | 7/1991 | Japan . |

*Primary Examiner*—John Guay
*Attorney, Agent, or Firm*—McDermott, Will & Emery

[57] ABSTRACT

An SRAM is provided with a high-resistance element for loading including a high-resistance portion, which extends onto adjacent memory cell. An interlayer insulating film is formed between the high-resistance portions.

9 Claims, 13 Drawing Sheets

STATIC RANDOM ACCESS MEMORY

BACKGROUND OF THE INVENTION

1. Field of the Invention

The present invention relates to a Static Random Access Memory (SRAM) and more particularly to an SRAM including a high-resistance element for loading.

2. Description of the Background Art

Conventionally, an SRAM is known as a volatile semiconductor memory device. An SRAM has memory cells at intersections of complementary data lines, or bit lines, and word lines arranged in a matrix. Each memory cell is composed of a flipflop circuit and two access transistors. By the flipflop circuit, two cross-coupled storage nodes are composed. An SRAM has a bistable state, (High, Low) or (Low, High), which state is kept as long as a predetermined power supply voltage (Vcc) is provided.

A semiconductor region of one access transistor is connected to a storage node, or an input/output terminal of the flipflop circuit, while a semiconductor region of the other access transistor is connected to a complementary data line. Each access transistor has a gate electrode connected to a word line, which controls conduction/non-conduction of the access transistor.

A flipflop circuit is composed of two driver transistors and two load elements. In a conventional SRAM, as disclosed in Japanese Patent Laying-Open No. 60-138956, for example, a high-resistance element has been used for loading which is made of high-resistance, polycrystalline silicon.

Recently, with an increasing demand for larger capacities, there has been a need to reduce the size of a memory cell. Accordingly, the above-mentioned high-resistance, polycrystalline silicon has been reduced in size, making it difficult to secure a sufficient length of high-resistance portion. Insufficient length of the high-resistance portion leads to an insufficient resistance value, which results in a large amount of current flowing through the high-resistance portion connected to a storage node at a Low level when the SRAM is on standby. Consequently, power consumption has been undesirably increased.

In view of such a problems there have been proposed measures for securing an adequate length of high-resistance portion in Japanese Patent Laying-Open Nos. 3-165560 and 61-283161.

Japanese Patent Laying-Open No. 3-165560 discloses a solution in which a resistance element is formed to extend onto an adjacent memory cell, whereby it becomes possible to secure a high-resistance portion with a sufficient length. However, since each resistance element is arranged in a horizontal direction here, an interval between interconnections is narrow, hindering further miniaturization.

Japanese Patent Laying-Open No. 61-283161 discloses a solution in which one high-resistance element is formed by connecting two, upper and lower, layers of high-resistance interconnections to each other. In this case, however, a failure in connection between the high-resistance interconnections may cause variation in high resistance values and, possibly, decrease in the yield.

In addition to the problems described above, there may be problems as follows. By reducing the size of a memory cell, the storage capacity of a storage node becomes inadequate. Reduction in the memory cell size leads to reduction of the size of each element connected to the storage node. Accordingly, parasitic capacitances of those elements also decrease. The storage capacity of a storage node includes parasitic capacitance of any element connected thereto. Therefore, as the parasitic capacitance of each element decreases, the storage capacity of the storage node of a memory cell becomes smaller than in a conventional case. Such a reduction in storage capacity may cause a soft error problem.

Here, a soft error means a random error occurring due to the inversion of information stored in a memory cell, which is caused by the event that electrons out of electron-hole pairs generated by incident $\alpha$ rays from the outside, e.g. from packaging materials, are attracted to a storage node in a memory cell.

SUMMARY OF THE INVENTION

The present invention is directed to solve the above-mentioned problems. An object of the present invention is to provide a static random access memory which is capable of reducing power consumption, adjusting itself to demands for miniaturization, and also suppressing the variation of high resistance values.

Another object of the present invention is to provide a static random access memory which is capable of improving immunity to a soft error, meeting the demands for miniaturization, and suppressing the variation of high resistance values.

A static random access memory according to the present invention includes first and second high-resistance elements for loading and an interlayer insulating film. The first high-resistance element for loading is formed by a first conductive layer including a first high-resistance portion. The interlayer insulating film is formed to cover the first high-resistance element for loading. The second high-resistance element for loading is formed on the interlayer insulating film, by a second conductive layer including a second high-resistance portion.

By providing an interlayer, insulating film between a first and second high-resistance elements for loading as described above, it becomes possible to extend each of the first and second high-resistance elements for loading onto an another memory cell if, for example, separate memory cells have the first and second high-resistance elements for loading, respectively. Consequently, a high resistance value can be obtained, with an adequate length of the first and second high-resistance portions being secured. As a result, power consumption can be decreased. If a single memory cell has both of the first and second resistance elements for loading, the first and second conductive layers can be overlapped with each other to form capacitance therebetween. Accordingly, the storage capacity for a storage node can be increased, whereby an improved immunity to a soft error can be obtained. In addition, since an interlayer insulating film is provided between the first and second high-resistance elements for loading, the second high-resistance element for loading can be formed on top of the first high-resistance element for loading, which arrangement can contribute to further miniaturization. Furthermore, since an adequate length of the first and second high-resistance portions can be secured as described above, a contact portion need not be provided in the first and second high-resistance portions as stated in Japanese Patent Laying-Open No. 61-283161. Accordingly, variation in resistance values of the first and second high-resistance portions can also be suppressed.

Figure 4:
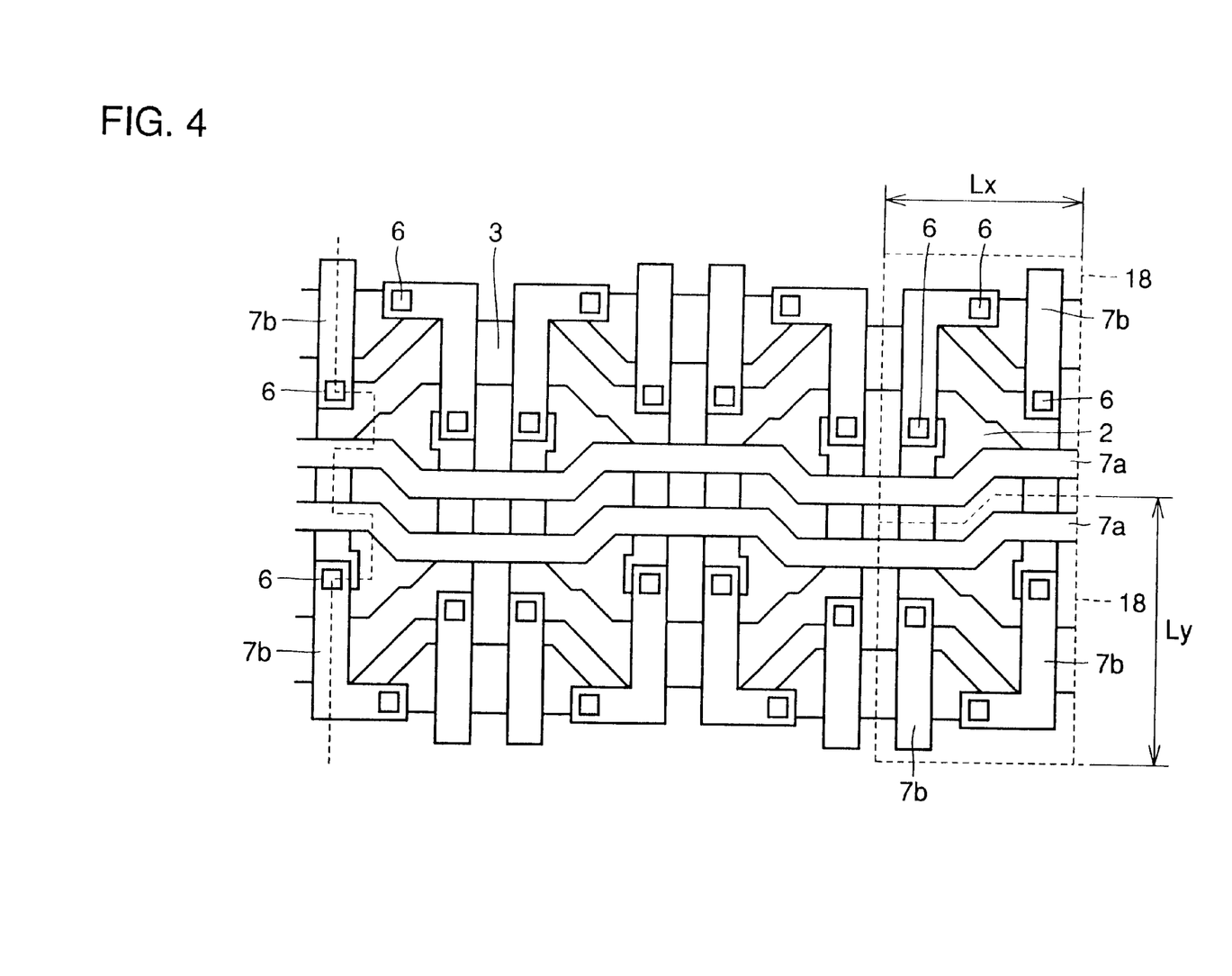
FIG. 4 is a top plan view showing the configuration of word lines and gate electrodes of driver transistors.

The above-mentioned static random access memory, which is formed on a semiconductor substrate, may include a plurality of memory cells having a pair of access transistors and a pair of driver transistors. The pair of access transistors and the pair of driver transistors are formed in a unit region in the semiconductor substrate. Here, a unit region is defined as a region in a semiconductor substrate in which a pair of access transistors and a pair of driver transistors in one memory cell are formed as shown in FIG. 4. Preferably, the above-mentioned first and second high-resistance portions have a length longer than the longest side of the unit region.

The first and second high-resistance portions can be long enough if these portions are made longer than the longest side of the unit region as described above. Accordingly, power consumption can be reduced.

The above-mentioned first and second conductive layers preferably have first and second low-resistance portions, respectively, which are electrically connected to each other. At this time, it is preferable that the second conductive layer is formed to overlap the first conductive layer with an interlayer insulating film therebetween, so that capacitance is formed of the first and second conductive layers and the interlayer insulating film.

By providing the capacitance as described above, it becomes possible to increase the storage capacity of a storage node in a memory cell. Accordingly, immunity to a soft error can be improved.

The above-mentioned first and second low-resistance portions may include interconnection portions for applying power supply voltage (Vcc) to the first and second high-resistance portions.

With such first and second low-resistance portions each having a respective interconnection portion, an interconnection portion having a double-layered structure can be realized. As a result, resistance at the interconnection portion can be reduced as compared with that in a conventional structure.

Alternatively, the first and second low-resistance portions can be stacked together to be used as a laser trimming fuse.

By using the thus stacked first and second low-resistance portions as a laser trimming fuse, a fuse with low resistance can be realized. Accordingly, propagation delay in a fuse circuit can be suppressed.

The above-mentioned interlayer insulating film preferably includes at least one of a 5 to 100 nm thick silicon oxide film and an insulating film having dielectric constant higher than that of the silicon oxide film.

By using such an insulating film as an interlayer insulating film, it becomes possible to increase the capacitance. Accordingly, the storage capacity of a storage node in a memory cell can effectively be increased, and immunity to a soft error can be improved.

Note that the second high-resistance portion is preferably made thicker than the first high-resistance portion.

It is necessary to adjust the resistance values of the first and second high-resistance portions to be equal to each other. However, the first and second high-resistance portions formed by polycrystalline silicon, for example, cannot have an equal resistance value even if they are similar in thickness and doped with an equal amount of impurities. This is because the first high-resistance portion undergoes heat treatment longer than the second high-resistance portion, whereby the resistance value of the first high-resistance portion generally becomes lower than that in the second high-resistance portion. Taking this into consideration, the second high-resistance portion is made thicker than the first high-resistance portion to reduce the resistance value at the second high-resistance portion, and thus ultimately the first and second high-resistance portions having an equal resistance value can be realized. As a result, variation in the characteristics between memory cells can be decreased.

It should be understood that different impurities can be introduced into the first and second high-resistance portions.

Figure 14:
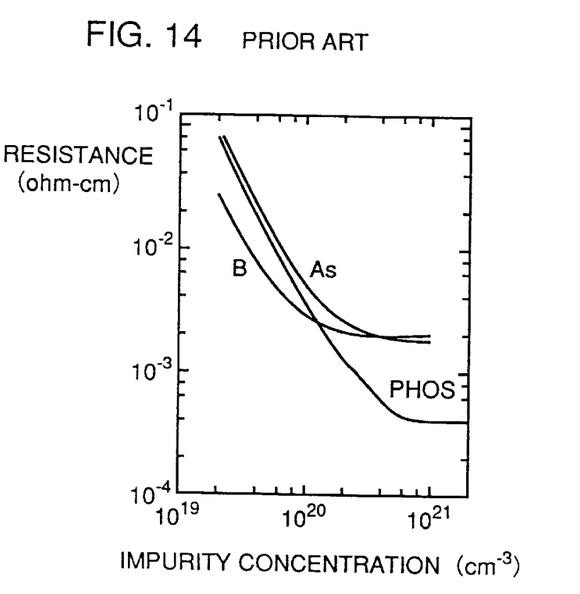
FIG. 14 is a graph showing a relation between the resistance value and the impurity concentration.

When the first and second high-resistance portions are formed by polycrystalline silicon, their resistance values can be differed according to the impurities introduced thereto, as shown in FIG. 14. Taking advantage of this phenomenon, an appropriate type of impurity can be selected to lower the resistance at the second high-resistance portion, so that the ultimate resistance values at the first and second high-resistance portions can be made equal.

Alternatively, when introducing impurities to the first and second high-resistance portions, the impurity concentration in the second high-resistance portion may be adjusted to be higher than in the first high-resistance portion.

By such an adjustment, the resistance value at the second high-resistance portion can be set low. Accordingly, the resultant resistance values at the first and second high-resistance portions can be made equal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to FIGS. 1–14.

First Embodiment

Figure 1:
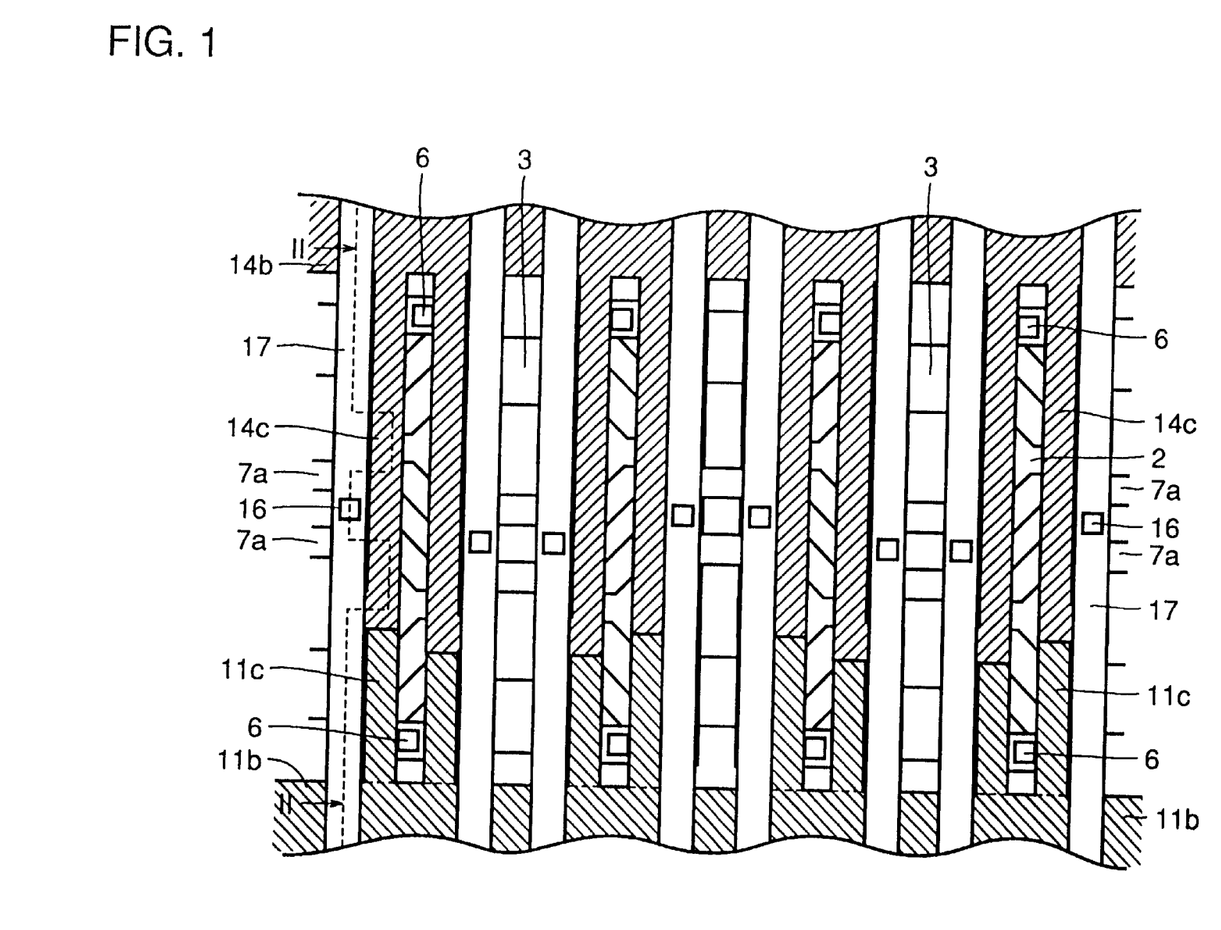
FIG. 1 is a top plan view showing memory cells in an SRAM according to a first embodiment of the present invention.
Figure 2:
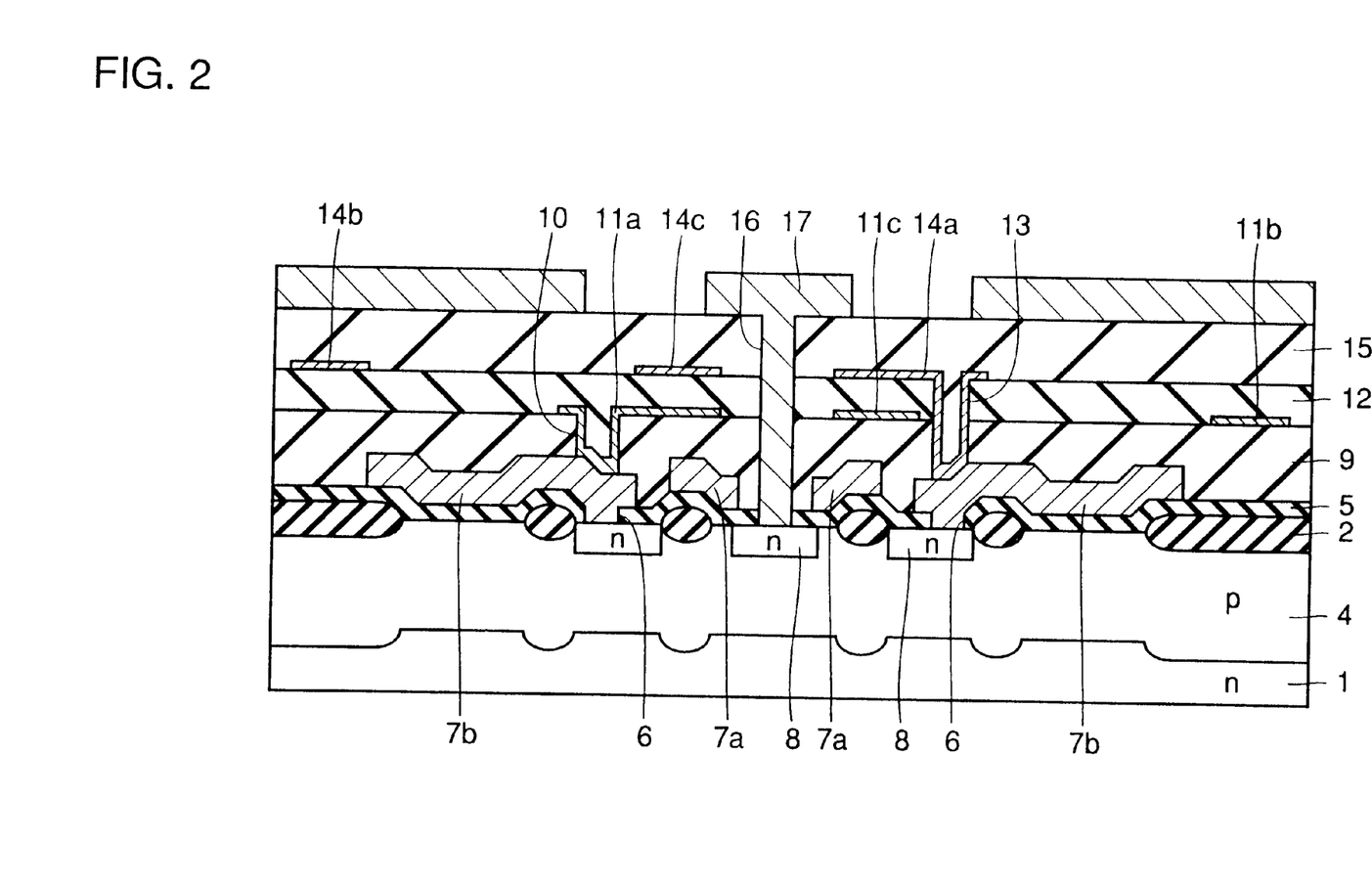
FIG. 2 is a sectional view taken along the line II—II in FIG. 1.

Referring first to FIGS. 1 to 6, the first embodiment of the present invention will be described. FIG. 1 is a top plan view showing 2×4 memory cells in an SRAM according to the first embodiment of the present invention. FIG. 2 is a sectional view taken along the line II—II in FIG. 1.

Referring to FIGS. 1 and 2, a p⁻ type well region 4 is formed in an n⁻ type silicon substrate 1. An n⁺ impurity region 8 is formed on the surface of p⁻ type well region 4. On the main surface of n⁻ type silicon substrate 1, a field insulating film 2 is formed, selectively with a thickness of 200 to 500 nm.

Formed on an element formation region, which is surrounded by field insulating film 2, is a gate insulating film 5, on which a gate electrode (a word line) 7a of an access transistor and a gate electrode 7b of a driver transistor are formed.

An interlayer insulating film 9 is formed to cover word line 7a and gate electrode 7b. Interlayer insulating film 9 is provided with a contact hole 10. A storage node portion 11a is formed from within contact hole 10 to extend onto interlayer insulating film 9. A Vcc interconnection portion 11b and a high-resistance portion 11c are also formed on interlayer insulating film 9.

A common conductive layer is patterned to form storage node portion 11a, Vcc interconnection portion 11b and high-resistance portion 11c, and an interlayer insulating film 12 is formed to cover them. A contact hole 13 is formed through interlayer insulating films 12, 9 to reach gate electrode 7b. A storage node portion 14a is formed from within contact hole 13 to extend onto interlayer insulating film 12. On interlayer insulating film 12, a Vcc interconnection portion 14b and a high-resistance portion 14c are formed.

Storage node portion 14a, Vcc interconnection portion 14b and high-resistance portion 14c are also formed by patterning a common conductive layer, and an interlayer insulating film 15 is formed to cover them. Through interlayer insulating films 15, 12, and 9, a contact hole 16 is formed to reach n⁺ impurity region 8. A bit line 17 is formed from within contact hole 16 to extend onto interlayer insulating film 15.

Next, with reference to FIGS. 3 to 6, a planar structure of memory cells in an SRAM according to the first embodiment will be described in order from a lower layer. At the same time, a manufacturing method of the SRAM will be explained as appropriate.

Figure 3:
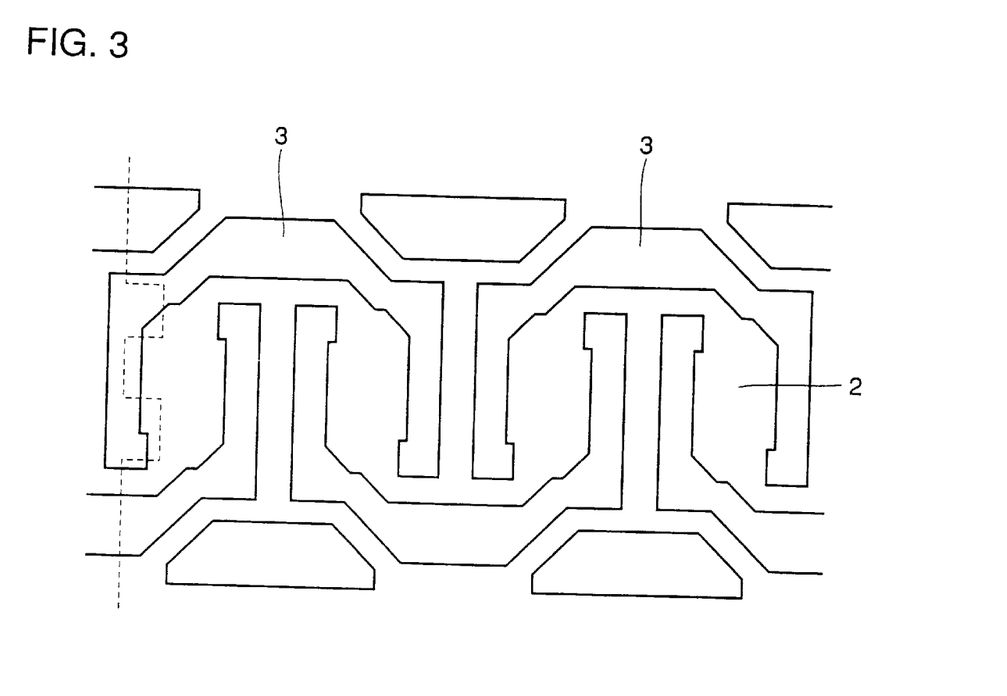
FIG. 3 is a top plan view showing the configuration of isolating insulating films and element formation regions in the SRAM according to the first embodiment.

Referring first to FIG. 3, the above-mentioned field insulating film 2 is formed to define the element formation region 3. After formation of field insulating film 2, a p type impurity, such as boron (B), is implanted into the entire main surface of n⁻ type silicon substrate 1 at 200 to 700 keV in an amount of the order of $1.0 \times 10^{12}$ to $1.0 \times 10^{13}$ cm⁻². The threshold voltage Vth of an access transistor and driver transistor is set by further implanting p type impurities, such as boron (B), for example at 30 to 70 keV in an amount of about $3.0 \times 10^{12}$ cm⁻². Accordingly, p⁻ type well region 4 is formed with the impurity concentration of the order of $10^{16}$ to $10^{18}$/cm³.

Next, the entire main surface of n⁻ type silicon substrate 1 is subjected to thermal oxidation to form gate insulating film 5 with a thickness of about 4 to about 10 nm. Thereafter, as shown in FIG. 4, a contact hole 6 is formed to expose a prescribed region in element formation region 3. Thereafter, a first layer of polycrystalline silicon film is formed using LPCVD (Low Pressure Chemical Vapor Deposition), by mixing gases such as phosphine ($PH_3$). This polycrystalline silicon film has a thickness of about 50 to about 200 nm, and includes phosphorus of the order of 1.0 to $8.0 \times 10^{20}$ cm⁻³, which film is patterned to form word line 7a and gate electrode 7b as shown in FIG. 4.

Note that word line 7a and gate electrode 7b may be formed by a so-called polycide interconnection, which is made of a metal silicide film such as a tungsten silicide ($WSi_2$) and a phosphorus-doped polycrystalline film. The first layer of polycrystalline silicon film has sheet resistance of 10 to 100 Ω/□.

After the formation of word line 7a and gate electrode 7b as described above, n type impurities, such as arsenic, are implanted into element formation region 3 to form n⁺ impurity region 8, and hence an access transistor and a driver transistor.

Each memory cell in an SRAM has a pair of access transistors and a pair of driver transistors. A certain region in a semiconductor substrate where the pair of access transistors and the pair of driver transistors are formed is herein referred to as a unit region 18. In the first embodiment as shown in FIG. 4, unit region 18 has a shorter side with a length Lx in the direction of a word line and a longer side with a length Ly in the direction of a bit line. Note that, in some layout, unit region 18 may be in the form of a square.

Figure 5:
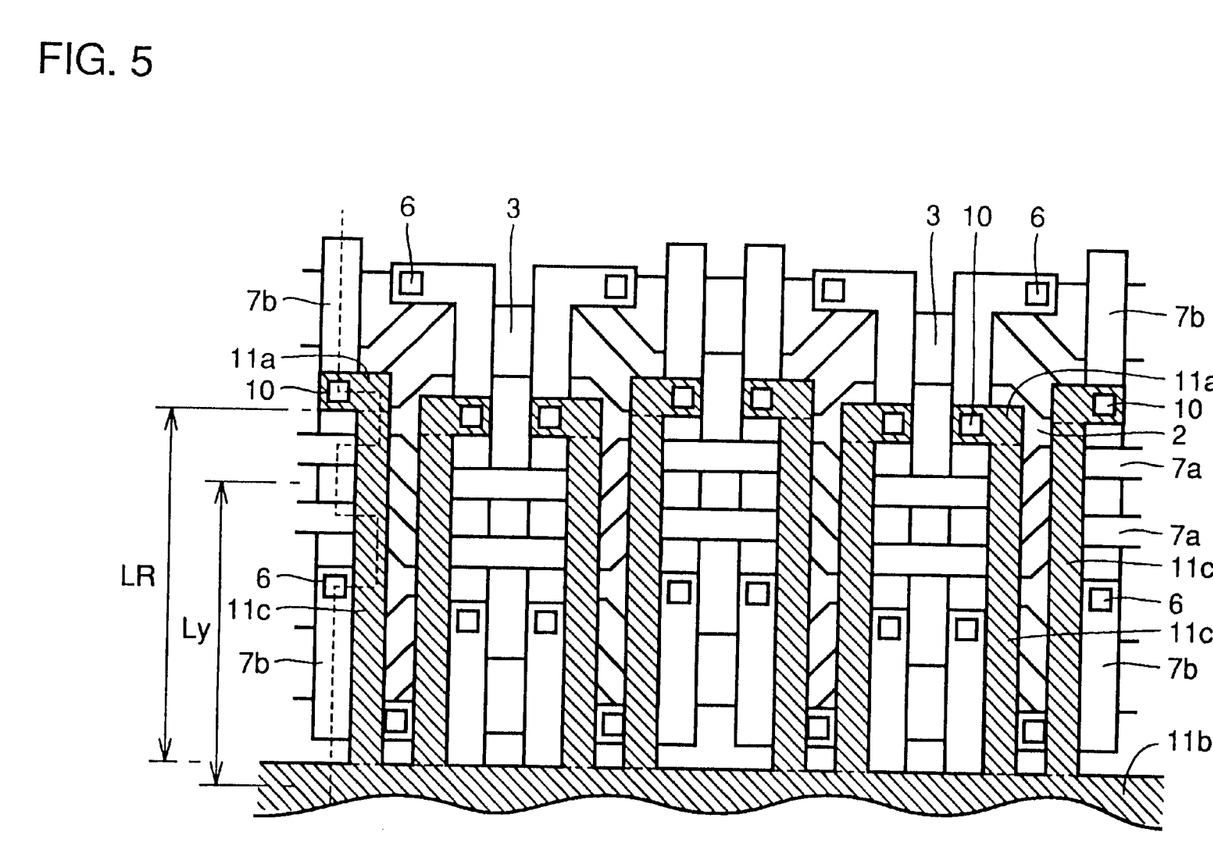
FIG. 5 is a top plan view showing the storage node portion, Vcc interconnection portion and high-resistance portion of one memory cell.

Next, an interlayer insulating film 9 is formed to cover word line 7a and gate electrode 7b, which film has a thickness of about 100 to about 1000 nm, and in which a contact hole 10 is formed as shown in FIG. 5. Thereafter, LPCVD, for example, is used to deposit a second layer of polycrystalline silicon film with a thickness of approximately 60 nm. This polycrystalline silicon film is patterned, and then phosphorus (P), for example, is implanted thereinto at 30 keV in an amount of the order of $1.0 \times 10^{13}$ cm⁻².

Next, a resist is formed to cover a portion at which high-resistance portion 11c is to be formed. Using this resist as a mask, arsenic (As) is implanted into the polycrystalline silicon film at 20 keV in an amount of $1.0 \times 10^{14}$ to $1.0 \times 10^{15}$ cm⁻². Thereafter, to activate all the impurities described above, annealing is performed at a temperature of about 700° C. to about 800° C. for about 20 minutes.

Accordingly, storage node portion 11a, Vcc interconnection portion 11b and high-resistance portion 11c are formed. In high-resistance portion 11c, which had been covered by the resist during the above-mentioned arsenic-implantation, only phosphorus has been implanted. As a result, the resistance value at high-resistance portion 11c is 100M to 10 TΩ each. Storage node portion 11a and Vcc interconnection portion 11b, both of which are low-resistance portions, have a sheet resistance value of 1 k to 100 kΩ/□.

It should be understood that, in the first embodiment, the length $L_R$ of high-resistance portion 11b is made longer than the length Ly of the longest side of unit region 18. Therefore, even if the memory cell size is reduced, an adequate length of high-resistance portion 11c can be secured, ensuring a high resistance value. As a result, there can be obtained an SRAM reduced in power consumption.

Figure 6:
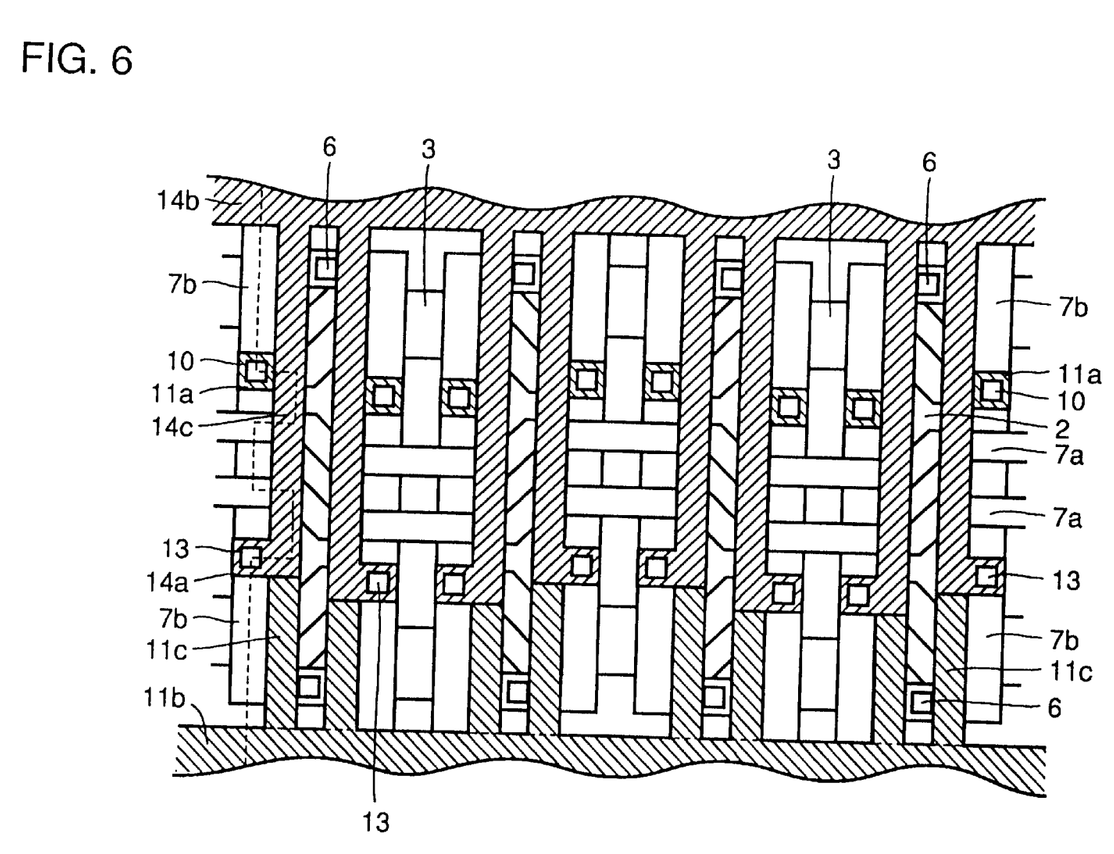
FIG. 6 is a top plan view showing the storage node portion, Vcc interconnection portion and high-resistance portion of another adjacent memory cell.

Next, LPCVD is used to deposit on the entire surface a silicon oxide film with a thickness of about 100 to about 300 nm, to form an interlayer insulating film 12. A contact hole 13 is formed through interlayer insulating films 12, 9 to reach gate electrode 7b. Thereafter, by LPCVD, a third layer of polycrystalline silicon film is deposited to have a thickness of about 100 nm. This polycrystalline silicon film is patterned to form storage node portion 14a, Vcc interconnection portion 14b and high-resistance portion 14c as shown in FIG. 6.

Thereafter, arsenic is implanted into the above-mentioned polycrystalline silicon film at 30 keV in an amount of about $2.2 \times 10^{13}$ cm$^{-2}$. Using as a mask a resist formed to cover a portion at which high-resistance portion 14c is to be formed, arsenic is implanted into the polycrystalline silicon film at 20 keV in an amount of $1.0 \times 10^{14}$ to $1.0 \times 10^{15}$ cm$^{-2}$. The impurities are then activated under the same condition as in the second layer of polycrystalline silicon film, and thus storage node portion 14a and Vcc interconnection portion 14b, both with low resistance, are provided. In high-resistance portion 14c, only $2.2 \times 10^{13}$ cm$^{-2}$ of arsenic has been implanted, since it had been covered by a resist during the second arsenic-implantation. As a result, high-resistance portion 14c has a resistance value of 100M to 10 TΩ each, which is higher than the sheet resistance of 1 k to 100 kΩ/□ at storage node portion 14a and Vcc interconnection portion 14b.

As described above, impurities implanted into high-resistance portions 11c and 14c are made different from each other both in amount and in type, and the two portions also have different thickness, which is due to the following reasons.

Figure 13:
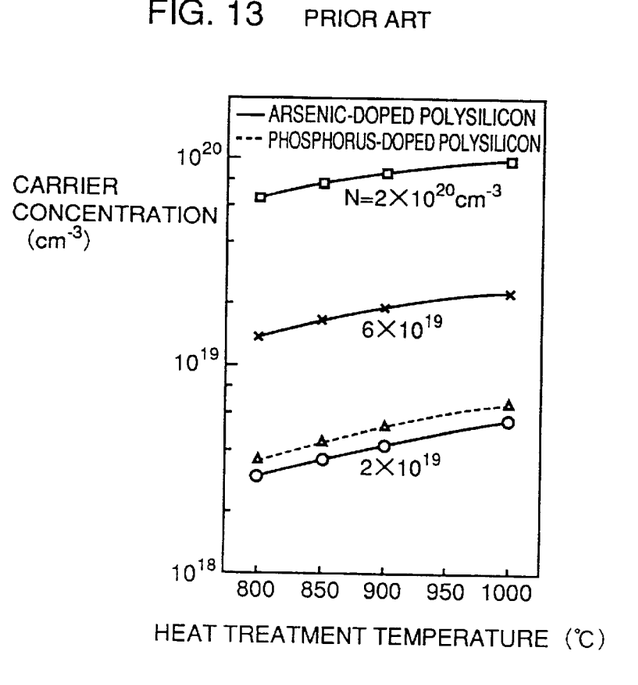
FIG. 13 is a graph showing a relation between the heat treatment temperature and the carrier concentration.

The high resistance values at high-resistance portions 11c, 14c cannot be made equal when they are made to have equal thickness and same impurity-implantation condition, since high-resistance portion 11c is subjected to extra heat treatment for a time period from the moment high-resistance portion 11c has been formed until the high-resistance portion 14c is complete, and also each of high-resistance portions 11c, 14c has underlayers uneven in thickness. More specifically, if high-resistance portions 11c, 14c are formed with same film thickness, same impurities, and same implantation condition, generally, high-resistance portion 11c, which is located lower in layers than high-resistance portion 14c, represents lower resistance. That is, as shown in FIG. 13, the carrier concentration in each portion varies according to changes in temperature and time for heat treatment after its formation, and so does the resistance value therein, which is proportional to the carrier concentration. Similarly, as shown in FIG. 14, the resistance value also varies depending on the impurity elements to be used. FIGS. 13 and 14 have been disclosed in "Polycrystalline Silicon for Integrated Circuit Applications" from KLUWER ACADEMIC PUBLISHERS.

As stated above, when using different impurities, it is required to increase the dose being used to form high-resistance portion 14c in the range of 10% to 250%, or, to make its film thickness 10% to 100% greater. By setting different film thicknesses or using different types of impurities with different doses for respective high-resistance portions 11c, 14c in such a manner, the ultimate resistance values at high-resistance portions 11c and 14c can be made approximately equal, and thus it becomes possible to reduce the variation in characteristics between memory cells.

Once storage node portion 14a, Vcc interconnection portion 14b and high-resistance portion 14c have been formed, next formed are an interlayer insulating film 15 of about 300 to about 1000 nm thick, a contact hole 16, and a bit line 17 made of, for example, 100 to 500 nm thick aluminum. An SRAM as shown in FIGS. 1 and 2 is thus complete through the processes described above.

Second Embodiment

Next, with reference to FIGS. 7 to 12, the second embodiment of the present invention will be described.

Figure 12:
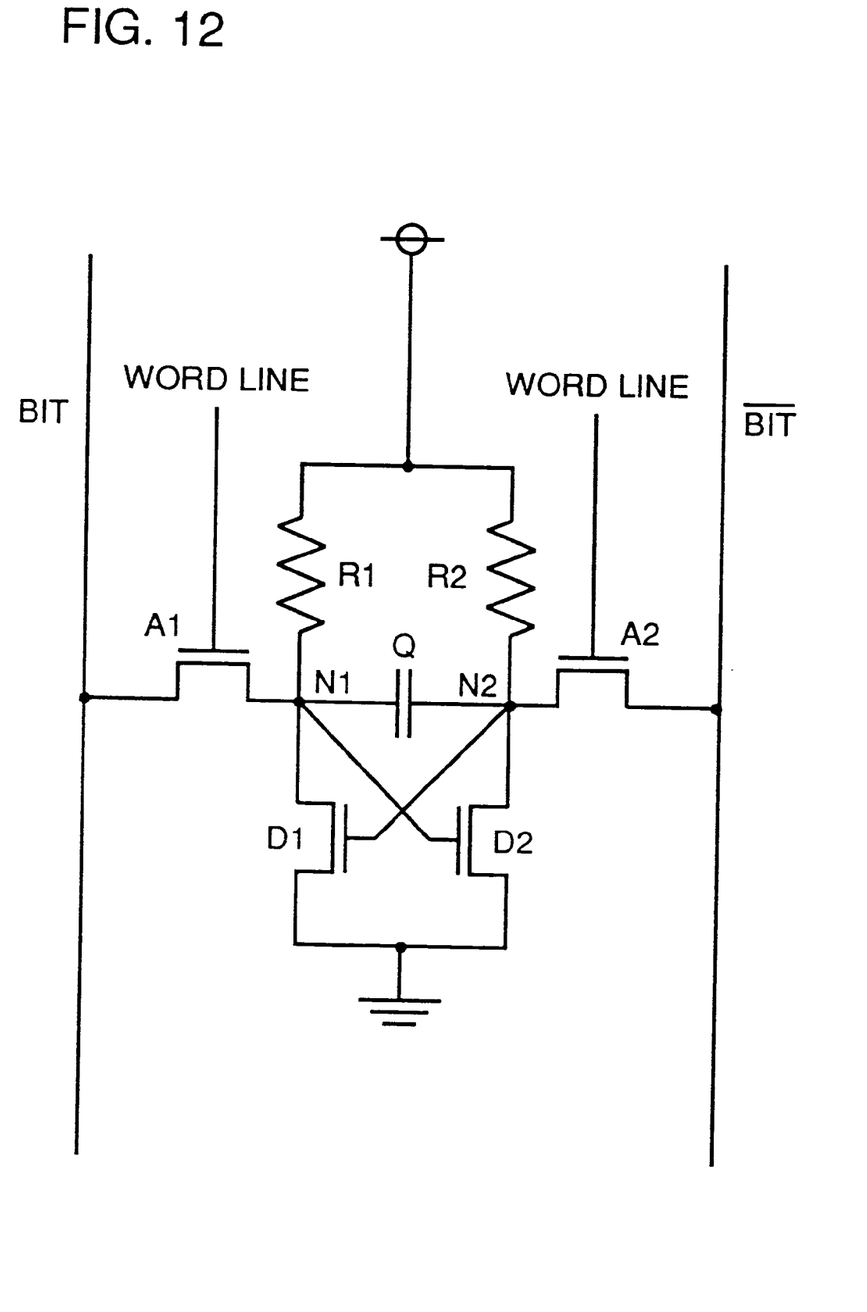
FIG. 12 is an equivalent circuit diagram for illustrating the characteristics of the SRAM according to the second embodiment.

Referring first to FIG. 12, characteristics of this embodiment will be described. As shown in FIG. 12, a memory cell in the SRAM is provided with a pair of access transistors A1, A2, a pair of driver transistors D1, D2, and a pair of load elements R1, R2. BIT and /BIT in FIG. 12 represent bit lines.

In such a configuration, in the second embodiment, there is formed capacitance between storage node portions N1 and N2 in order to increase the storage charge Q therebetween.

Such capacitance increases the storage capacity of the storage nodes of a memory cell, thereby making it possible to improve immunity to a soft error.

Figure 7:
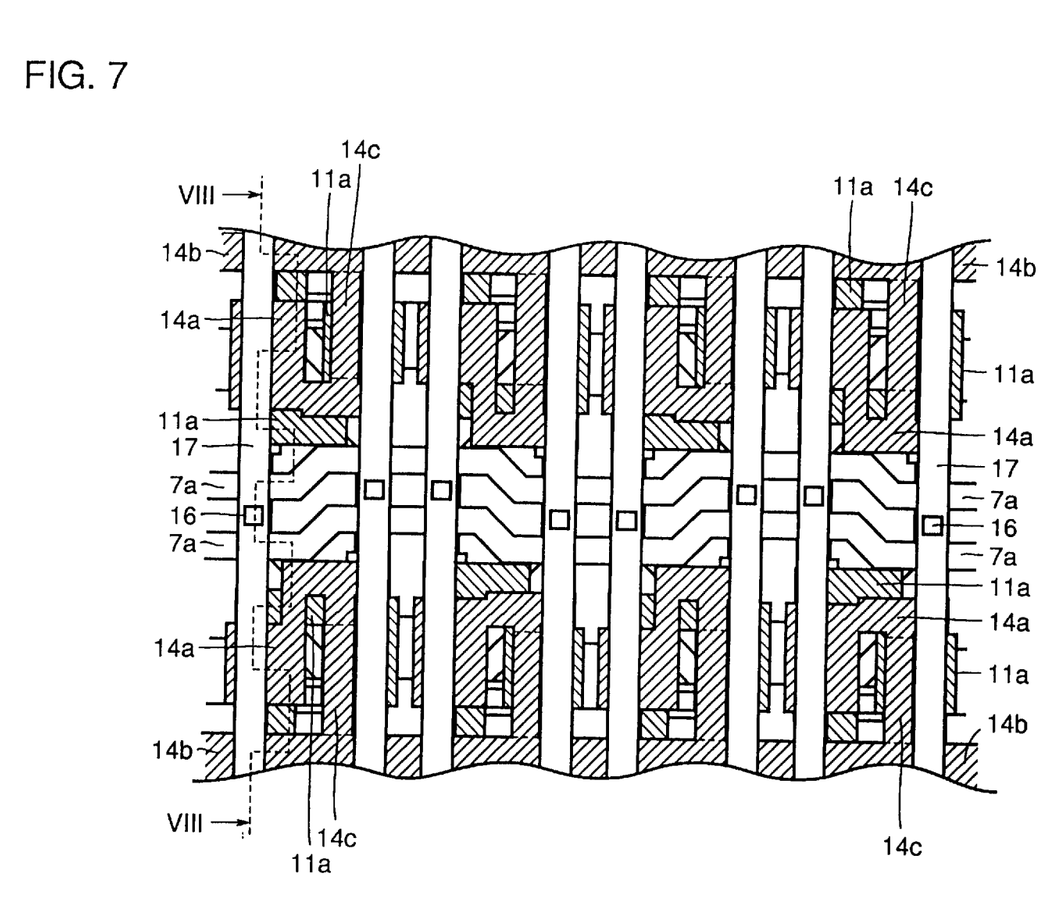
FIG. 7 is a top plan view showing memory cells in an SRAM according to a second embodiment of the present invention.
Figure 8:
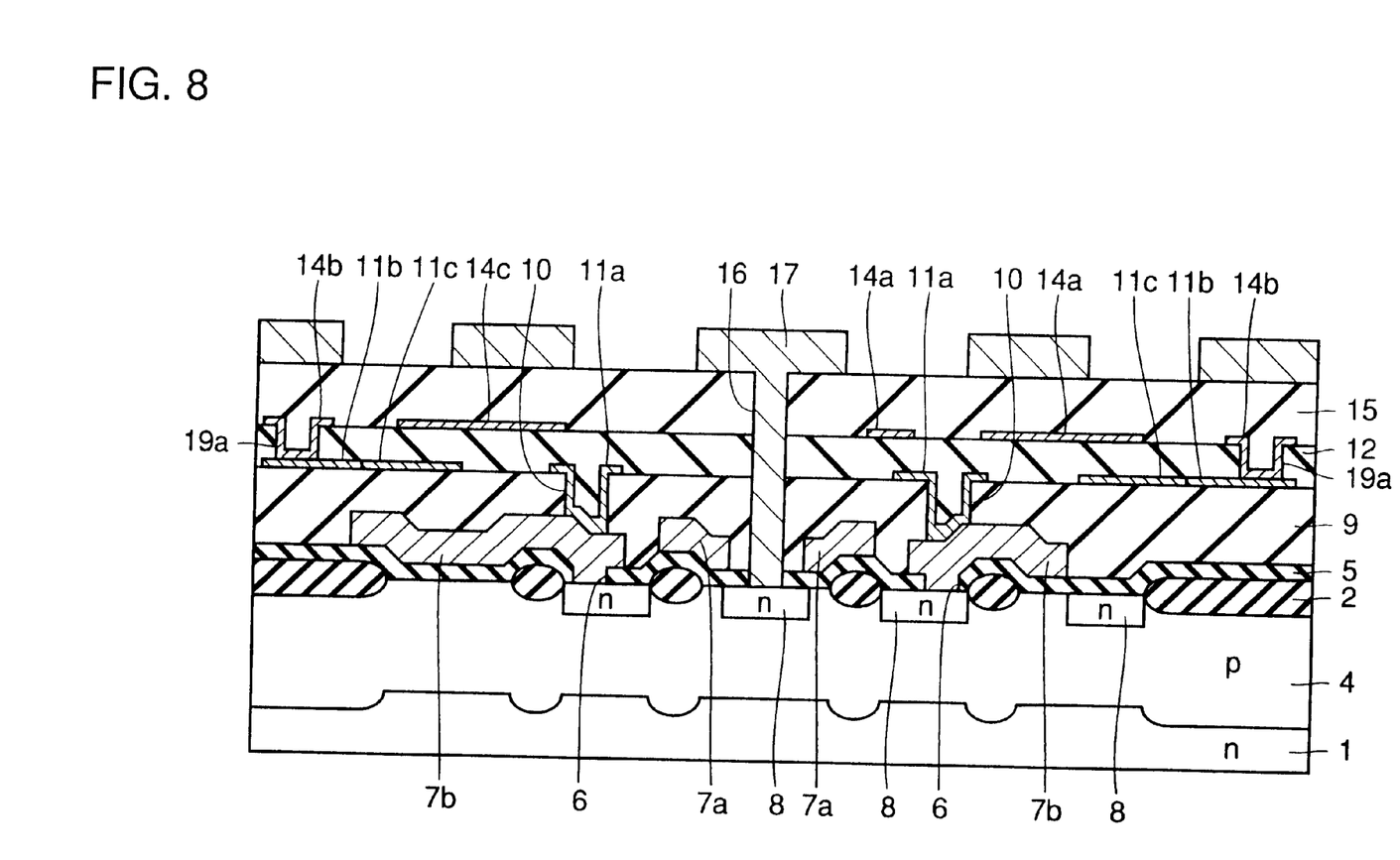
FIG. 8 is a sectional view taken along the line VIII—VIII in FIG. 7.
Figure 9:
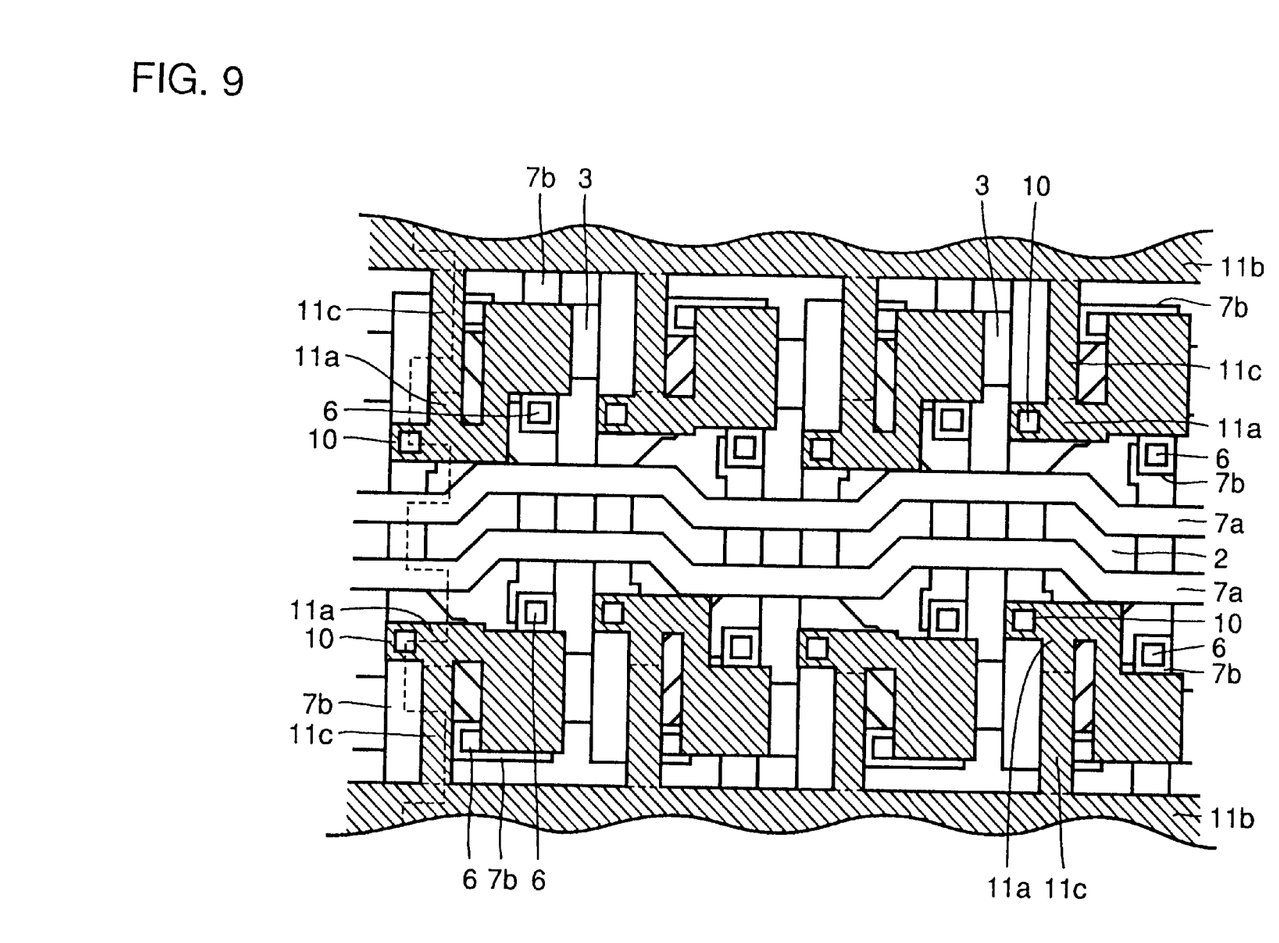
FIG. 9 is a top plan view showing one storage node portion, Vcc interconnection portion, and high-resistance portion for each memory cell.
Figure 10:
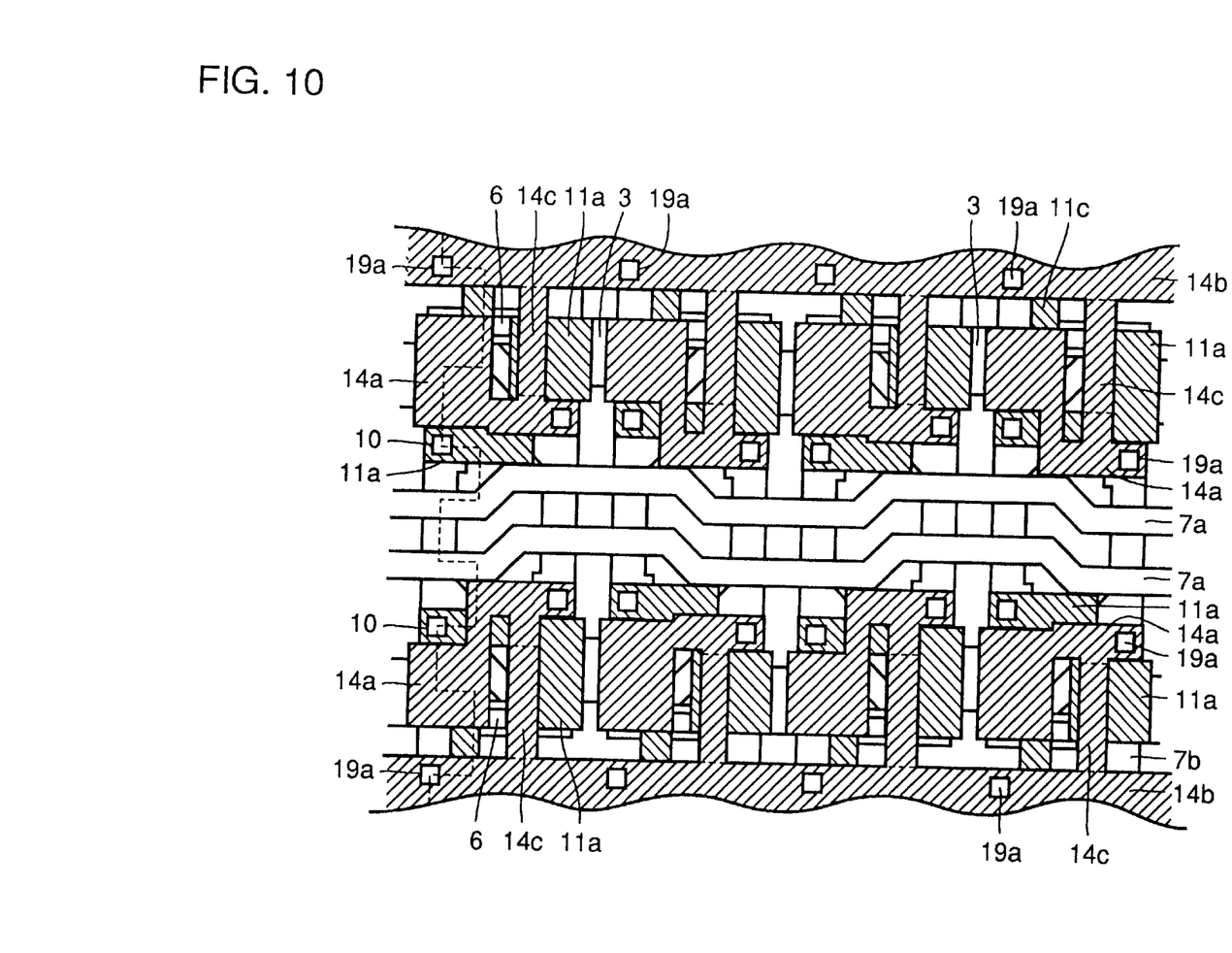
FIG. 10 is a top plan view showing the other storage node portion, Vcc interconnection portion and high-resistance portion for each memory cell.

Next, with reference to FIGS. 7 to 10, the above discussion will be explained more specifically. In the second embodiment, load elements R1 and R2 in each memory cell are formed by different conductive layers. In particular, as shown in FIGS. 7 and 8, high-resistance portions 11c and 14c are formed by separate interconnections layers. Further as shown in FIGS. 9 and 10, an overlapping portion is provided between storage node portion 11a and storage node portion 14a or high-resistance portion 14c, or, between storage node portion 14a and storage node portion 11a or high-resistance portion 11c, to form capacitance. Accordingly, the storage capacitance Q for the storage nodes can be increased.

At this time, it is possible to form the interlayer insulating film 12 shown in FIG. 8 by a silicon oxide film ($SiO_2$) with a thickness of about 5 to about 100 nm, or, a high-dielectric film having a dielectric constant higher than that of a silicon oxide film, such as a silicon nitride film ($Si_3N_4$), $Si_3N_4/SiO_2$ or $SiO_2/Si_3N_4/SiO_2$, to increase capacitance. As a result, the storage capacity of a storage node can be increased more effectively.

Note that Vcc interconnection portions 11b and 14b are shunted to each other through contact hole 19a. Accordingly, those Vcc interconnection portions can be formed by a conductive layer having a double-layered structure, and thus the resistance values at the Vcc interconnections can be reduced.

Figure 11:
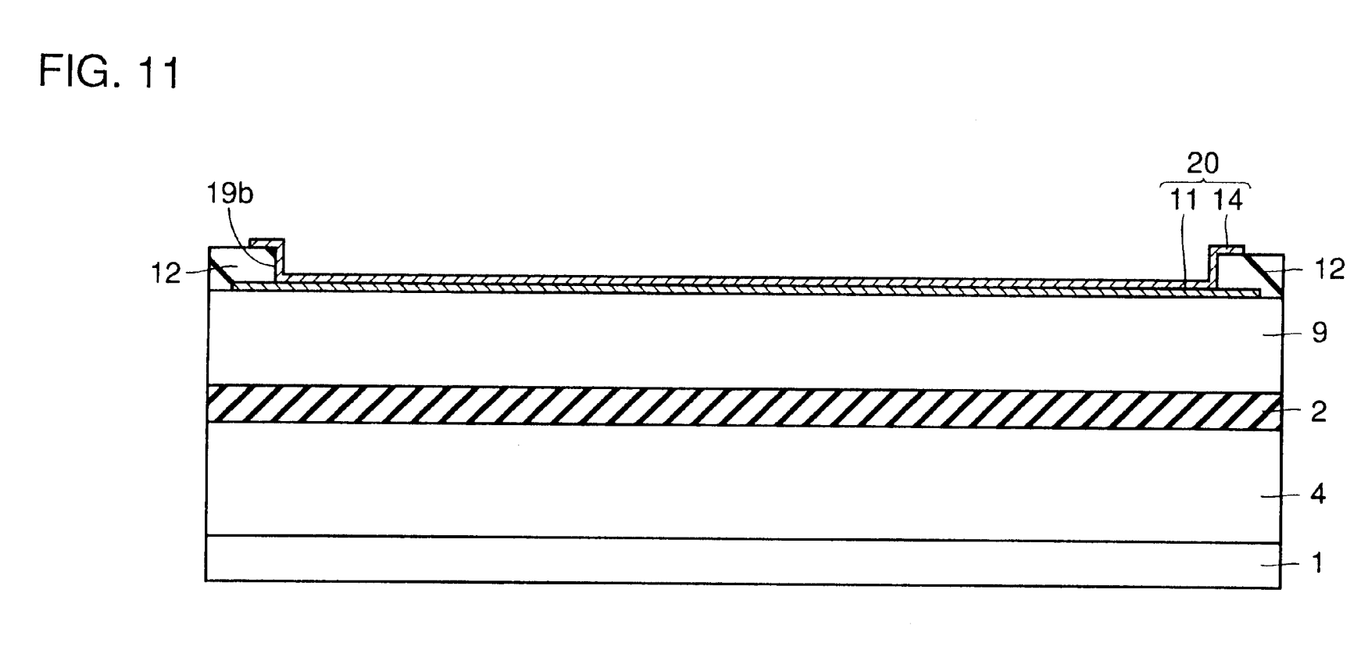
FIG. 11 is a section view showing the configuration of a laser trimming fuse according to the second embodiment.

Furthermore, as shown in FIG. 11, a contact hole 19b having a large opening diameter may be first formed, and then, a polycrystalline silicon film 11 for forming Vcc interconnection portion 11b and another polycrystalline silicon film 14 for Vcc interconnection portion 14b may be formed thereon. Finally, a laser trimming fuse 20 can be formed by those two polycrystalline silicon films. Propagation delay in a fuse circuit can thus be suppressed using such a fuse 20.

As described above, a static random access memory according to the present invention permits reduction in power consumption as well as improvement in immunity to soft errors. Therefore, a high-performance, high-reliability static random access memory can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static random access memory, comprising:
   a first high-resistance element for loading formed by a first conductive layer including a first high-resistance portion;

an interlayer insulating film formed to cover said first high-resistance element for loading; and a second high-resistance element for loading formed on said interlayer insulating film by a second conductive layer including a second high-resistance portion, said second high-resistance element partially overlapping but electrically isolated from the first high-resistance element.

2. The static random access memory according to claim 1, formed on a semiconductor substrate and including a plurality of memory cells each having a pair of access transistors and a pair of driver transistors, wherein said pair of access transistors and said pair of driver transistors are formed in a unit region of said semiconductor substrate, and said first and second high-resistance portions are each longer than the longest side of said unit region.

3. The static random access memory according to claim 1, wherein said first and second conductive layers include first and second low-resistance portions, respectively, said first and second low-resistance portions are electrically connected to each other, and said second conductive layer is formed to overlap said first conductive layer with said interlayer insulating film interposed therebetween, and capacitance is formed by said first and second conductive layers and said interlayer insulating film.

4. The static random access memory according to claim 3, wherein said first and second low-resistance portions have interconnection portions for applying a power supply voltage to said first and second high-resistance portions, respectively.

5. The static random access memory according to claim 3, wherein said first and second low-resistance portions are stacked together to be used as a laser trimming fuse.

6. The static random access memory according to claim 3, wherein said interlayer insulating film includes at least one of a silicon oxide film with a thickness of 5 to 100 nm, and an insulating film having a dielectric constant higher than that of the silicon oxide film.

7. The static random access memory according to claim 1, wherein said second high resistance portion has a thickness greater than that of said first high-resistance portion.

8. The static random access memory according to claim 1, wherein different impurities are introduced into said first and second high-resistance portions.

9. The static random access memory according to claim 1, wherein impurities are introduced into said first and second high-resistance portions, and concentration of said impurities in said second high-resistance portion is made higher than that in said first high-resistance portion.

* * * * *